United States Patent
Wang

(10) Patent No.: US 11,314,917 B2
(45) Date of Patent: Apr. 26, 2022

(54) JUMPER CAP CIRCUIT AND METHOD FOR DESIGNING THE SAME

(71) Applicant: ZHENGZHOU YUNHAI INFORMATION TECHNOLOGY CO., LTD., Henan (CN)

(72) Inventor: Peng Wang, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 348 days.

(21) Appl. No.: 16/493,292

(22) PCT Filed: Mar. 8, 2019

(86) PCT No.: PCT/CN2019/077411
§ 371 (c)(1),
(2) Date: Sep. 11, 2019

(87) PCT Pub. No.: WO2020/007061
PCT Pub. Date: Jan. 9, 2020

(65) Prior Publication Data
US 2021/0406440 A1    Dec. 30, 2021

(30) Foreign Application Priority Data

Jul. 5, 2018 (CN) .......................... 201810729944.0

(51) Int. Cl.
*G06F 30/394* (2020.01)
*G06F 30/36* (2020.01)
*G06F 13/40* (2006.01)

(52) U.S. Cl.
CPC ........ *G06F 30/394* (2020.01); *G06F 13/4068* (2013.01); *G06F 30/36* (2020.01)

(58) Field of Classification Search
CPC .. G06F 13/385; G06F 30/394; G06F 13/4068; G06F 30/36; G06F 13/387; H03K 19/017509
See application file for complete search history.

(56) References Cited

U.S. PATENT DOCUMENTS 4,742,482 A * 5/1988 Inskeep ................... H04M 11/06
                                                    365/228
4,825,402 A * 4/1989 Jalali ............... H03K 19/017545
                                                    375/257

(Continued)

FOREIGN PATENT DOCUMENTS

CN        102830782 A      12/2012
CN        204731586 U      10/2015

(Continued)

OTHER PUBLICATIONS

International Search Report for PCT/CN2019/077411 dated May 16, 2019, ISA/CN.

*Primary Examiner* — Helen Rossoshek
(74) *Attorney, Agent, or Firm* — Yue (Robert) Xu; Apex Attorneys at Law, LLP

(57) ABSTRACT

A jumper cap circuit and a method for designing the same are provided. The jumper cap circuit includes: a three-pin header, a chip, a pull-up resistor or a pull-down resistor, and a resistor R1. The header is connected to the chip via the pull-up resistor or the pull-down resistor, and a voltage dividing circuit is constituted by the resistor R1 and the pull-up resistor or the pull-down resistor, and the resistor R1 is connected to a pin of the pin header. The method includes: acquiring a default input state of a chip, and setting, based on the default input state of the chip, a default value of the chip by arranging a first resistor in a path where a first pin (Continued)

of the three-pin header is located and arranging a second resistor in a path where a second pin of the three-pin header is located.

8 Claims, 4 Drawing Sheets

(56) References Cited

U.S. PATENT DOCUMENTS

| | | | | |
|---|---|---|---|---|
| 5,014,002 | A * | 5/1991 | Wiscombe | G01R 1/02 324/537 |
| 5,675,794 | A * | 10/1997 | Meredith | G06F 15/177 710/104 |
| 5,701,417 | A * | 12/1997 | Lewis | G06F 9/4405 709/222 |
| 6,496,969 | B2 | 12/2002 | Feng et al. | |
| 6,647,436 | B1 * | 11/2003 | Jedrzejewski | G06F 13/385 710/14 |
| 6,691,238 | B1 * | 2/2004 | Forbes | G06F 1/3203 713/320 |
| 7,089,412 | B2 * | 8/2006 | Chen | G06F 13/1689 713/2 |
| 7,266,314 | B2 * | 9/2007 | Takami | G03G 15/2039 399/33 |
| 7,305,528 | B2 * | 12/2007 | Zhu | G06F 13/4239 711/103 |
| 7,475,304 | B1 * | 1/2009 | Kaufman | G01R 31/3171 714/706 |
| 7,594,054 | B2 * | 9/2009 | Joos | G06F 13/385 710/305 |
| 9,093,106 | B2 * | 7/2015 | Otaguro | G11B 19/28 |
| 9,424,886 | B1 * | 8/2016 | Ma | G11B 19/046 |
| 9,795,002 | B2 * | 10/2017 | Masazumi | H05B 45/58 |
| 10,409,545 | B1 * | 9/2019 | Olson | G06F 13/4282 |
| 2006/0290210 | A1 * | 12/2006 | Foard | H02G 3/00 307/147 |
| 2009/0265792 | A1 * | 10/2009 | Martinez | G06F 21/572 726/29 |
| 2012/0324247 | A1 | 12/2012 | Wu et al. | |
| 2014/0240966 | A1 * | 8/2014 | Garcia | F21S 9/024 362/183 |

FOREIGN PATENT DOCUMENTS

| | | |
|---|---|---|
| CN | 206515811 U | 9/2017 |
| CN | 108920398 A | 11/2018 |

* cited by examiner

JUMPER CAP CIRCUIT AND METHOD FOR DESIGNING THE SAME

The present application is a national phase of International Patent Application No. PCT/CN2019/077411, titled "JUMPER CAP CIRCUIT AND METHOD FOR DESIGNING THE SAME", filed on Mar. 8, 2019, which claims the priority to Chinese Patent Application No. 201810729944.0, titled "JUMPER CAP CIRCUIT AND METHOD FOR DESIGNING THE SAME", filed on Jul. 5, 2018 with the Chinese Patent Office, both of which are incorporated herein by reference their entireties.

TECHNICAL FIELD

The present disclosure relates to the technical field of designing server systems, and in particular to a jumper cap circuit and a method for designing the same.

BACKGROUND

A motherboard of a server is generally provided with a variety of headers and jumper caps. A level of a signal supplied to the header may be changed by changing a position of a jumper cap, thus parameters of the header are set to suit for a chip. In a case that the server is originally manufactured, default parameters are set for the server, to ensure a normal operation of the server for a first usage. These default parameters are set by connecting the jumper cap to different pins of the header.

A connection manner in a conventional jumper cap circuit is as shown in FIG. 1. As shown in FIG. 1, for setting parameters, a pin1 of a three-pin header is connected to a power supply Vcc, a pin2 of the three-pin header is connected to a chip, and a pin3 of the three-pin header is connected to the ground GND. The three-pin header is generally used to set two default parameters. One default parameter represents a high level, which is realized by connecting the pin1 and the pin2 with a jumper cap, thus a signal inputted to the chip is at a high level, which is defined as a logic 1. The other one default parameter represents a low level, which is realized by connecting the pin2 and the pin3 with a jumper cap, thus a signal inputted to the chip is at a low level, which is defined as logic 0.

However, the jumper cap may be fell off due to vibration during the transportation of a server, and there is no protective measure provided for the connection manner in the conventional circuit for setting default parameters. As a result, a signal line connected to the pin 2 is floated if the jumper cap is fell off, thereby resulting in an abnormal operation of the chip, thus affecting the performance of the server.

SUMMARY

A jumper cap circuit is provided, which includes a three-pin header and a chip, a pull-up resistor or a pull-down resistor, and a resistor R1. The three-pin header is connected to the chip via the pull-up resistor or the pull-down resistor. The resistor R1 and the pull-up resistor constitute a voltage dividing circuit or the resistor R1 and the pull-down resistor constitute a voltage dividing circuit. The resistor R1 is connected to a pin of the three-pin header. A resistance of the resistor R1 is equal to or greater than ten times of that of the pull-up resistor. The resistance of the resistor R1 is equal to or greater than ten times of that of the pull-down resistor.

A method for designing a jumper cap circuit is further provided, which is applicable to a jumper cap circuit including a three-pin header and a chip. The method includes:

acquiring a default input state of the chip, where the default input state comprises a high level state and a low level state; and setting, based on the default input state of the chip, a default value of the chip by arranging a first resistor in a path where a first pin of the three-pin header is located and arranging a second resistor in a path where a second pin of the three-pin header is located.

The default value of the chip includes logic 0 or logic 1. The second resistor is a pull-up resistor or a pull-down resistor. The second pin is a pin of the three-pin header which is connected to the chip. The first resistor and the second resistor constitute a voltage dividing circuit. A resistance of the first resistor is equal to or greater than ten times of that of the second resistor.

BRIEF DESCRIPTION OF THE DRAWINGS

In order to more clearly describe the technical solution in the embodiments of the present disclosure or the technical solution in the conventional art, drawings to be used in the description of the embodiments of the present disclosure or the conventional art are briefly described hereinafter. It is apparent that the drawings described below show merely the embodiments of the present disclosure, and those skilled in the art may obtain other drawings according to the provided drawings without any creative effort.

DETAILED DESCRIPTION OF THE EMBODIMENTS

In order to make those skilled in the art better understand the technical solutions of the present disclosure, the technical solutions in the embodiments of the present disclosure are described clearly and completely hereinafter in conjunction with the drawings in the embodiments of the present disclosure. Apparently, the described embodiments are only some rather than all of the embodiments of the present disclosure. All other embodiments obtained by those skilled in the art based on the embodiments of the present disclosure without any creative work should fall within the protection scope of the present disclosure.

In order to better understand the technical solutions of the present disclosure, the embodiments of the present disclosure are described in detail below with reference to the drawings.

Embodiment One

Figure 1:
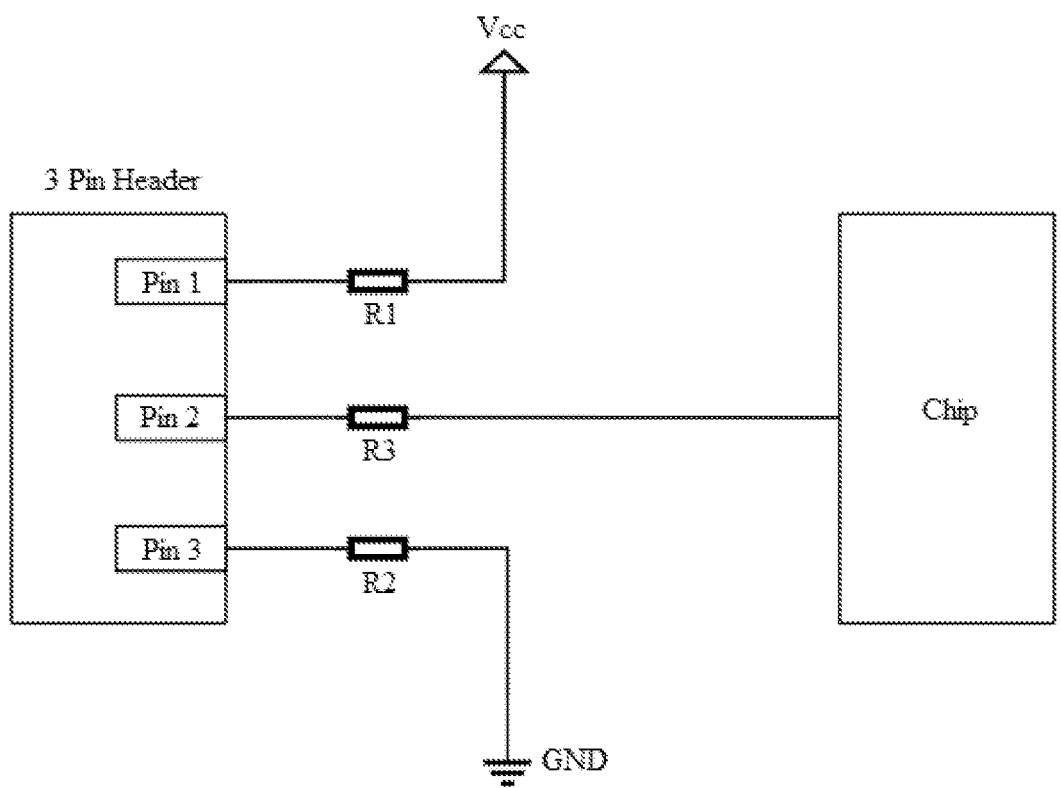
FIG. 1 is schematic diagram of a jumper cap circuit in the conventional art.
Figure 2:
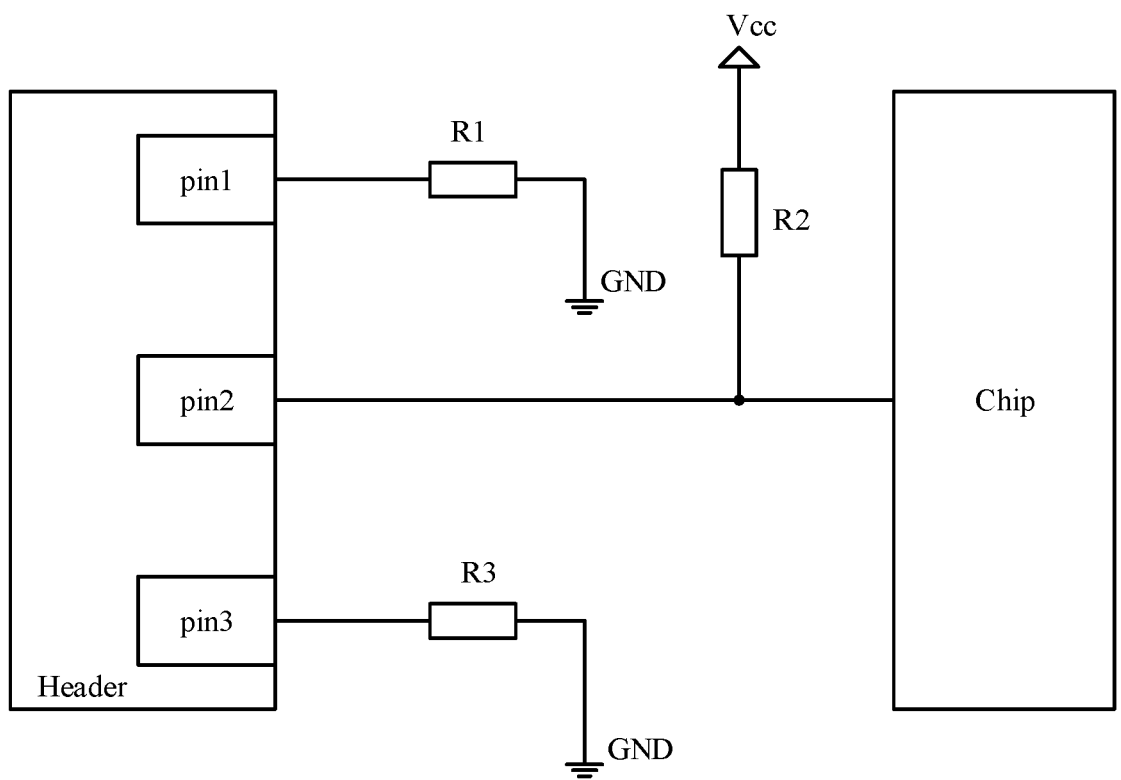
FIG. 2 is schematic diagram of a jumper cap circuit according to an embodiment of the present disclosure.

Reference is made to FIG. 2, which is schematic diagram of a jumper cap circuit according to an embodiment of the present disclosure. As shown in FIG. 2, in the present embodiment, the jumper cap circuit includes a three-pin header, a chip, and a pull-up resistor R2. The three-pin header is connected to the chip via the pull-up resistor R2. In FIG. 2, a pin1 is a first pin, a pin2 is a second pin, a pin3 is a third pin. A resistor R1 is connected to the first pin. The pull-up resistor R2 is connected to the second pin, and a resistor R3 is connected to the third pin.

In the present embodiment, in the jumper cap circuit, the default input state of the chip is a high level state. The first pin is grounded via the resistor R1, and the second pin is connected to the chip after a level of the second pin is pulled up by the pull-up resistor R2. The resistance of the resistor R1 is equal to or greater than ten times of that of the pull-up resistor R2.

According to the above arrangement, the resistor R2 serves as a pull-up resistor, the second pin of the three-pin header is connected to the chip after the level of the second pin is pulled up by the resistor R2. The resistor R1 and the pull-up resistor R2 constitute a voltage dividing circuit, such that the input state of the chip remains at a high level state. Specifically, in a case that the jumper cap is not fell off, the level of the second pin is pulled up to Vcc by the pull-up resistor R2, and the resistor R1 and the resistor R2 constitute a voltage dividing circuit, such that a voltage supplied to the chip is expressed by Vcc*R1/(R1+R2). Since the resistance of the first resistor R1 is equal to or greater than ten times of that of the second pull-up resistor R2, the following equation can be derived: Vcc*R1/(R1+R2)–≈Vcc. Therefore, the voltage inputted to the chip is approximately equal to Vcc, that is, the input of the chip is logic 1. In a case that the jumper cap is fell off, the second pin of the three-pin header is floated, and the chip is still connected to the power supply Vcc via the resistor R2, such that the voltage inputted to the chip is still equal to Vcc, that is, the input of the chip is still logic 1.

Therefore, with the jumper cap circuit in the present embodiment, the chip can remain at an initial default input state even if a jumper cap is fell off, thereby ensuring a correct logic of the chip, thus ensuring the normal operation of the chip.

Furthermore, in the jumper cap circuit of the present disclosure, the third pin of the three-pin header is grounded via the resistor R3, and the resistance of the pull-up resistor R2 is equal to or greater than ten times of that of the third resistor R3.

Specifically, as can be seen from FIG. 2, in the default input state of the jumper cap circuit, the pin1 and the pin2 are connected with a jumper cap, and a voltage supplied to the chip is equal to a voltage across the resistor R1, thus the voltage supplied to the chip is expressed by Vcc*R1/(R1+R2). Since the resistance of the first resistor R1 is equal to or greater than ten times of that of the second pull-up resistor R2, the following equation may be derived: Vcc*R1/(R1+R2)≈Vcc, that is, the input of the chip is logic 1. In a case that the pin2 and the pin3 are connected with a jumper cap, the voltage supplied to the chip is equal to the voltage across the resistor R3, thus the voltage supplied to the chip is expressed by Vcc*R3/(R2+R3). Since the resistance of the first pull-up resistor R2 is equal to or greater than ten times of that of the second pull-up resistor R3, the following equation can be derived: Vcc*R3/(R2+R3)≈0, that is, the input of the chip is logic 0. Therefore, in a case that the jumper cap is not fell off, the default input state of the chip is a high level state, that is, the input of the chip is logic 1, and in a case that the jumper cap is fell off, as can be seen from FIG. 2, the second pin of the three-pin header is floated, the voltage supplied to the chip is Vcc, thus the input of the chip is still logic 1. Therefore, in the embodiment, the resistances of the three resistors in the jumper cap circuit are set to meet certain conditions, it can be ensured that the default input state of the chip is a high level state no matter the jumper cap is fell off or not fell off, thereby ensuring the normal operation of the chip.

In the embodiment, the third pin of the three-pin header is grounded via a resistor R3, such that the resistor R3 and the pull-up resistor R2 constitute a voltage dividing circuit, thus facilitating the balance of the circuit. Moreover, the resistor R3 is arranged such that the subsequent debugging operation on the jumper cap circuit is facilitated. For example, the resistor R3 may be reset to have other resistances to facilitate the debugging operation on the jumper cap circuit, thereby improving the flexibility of the jumper cap circuit.

In addition, in the embodiment, the third pin of the three-pin header may be directly grounded via a wire.

Furthermore, in the present disclosure, the chip is provided with a Strap pin, which is a pin to which a level of an input is determined by an external jumper wire. The Strap pin has a multiplexing function, and may serve as a multiplexing pin. For example, the Strap pin operates for a certain function during a power-on and reset stage, and operates for another function during the normal operation. In the present disclosure, the header is a three-pin header, that is, the header has three pins.

Embodiment Two

Figure 3:
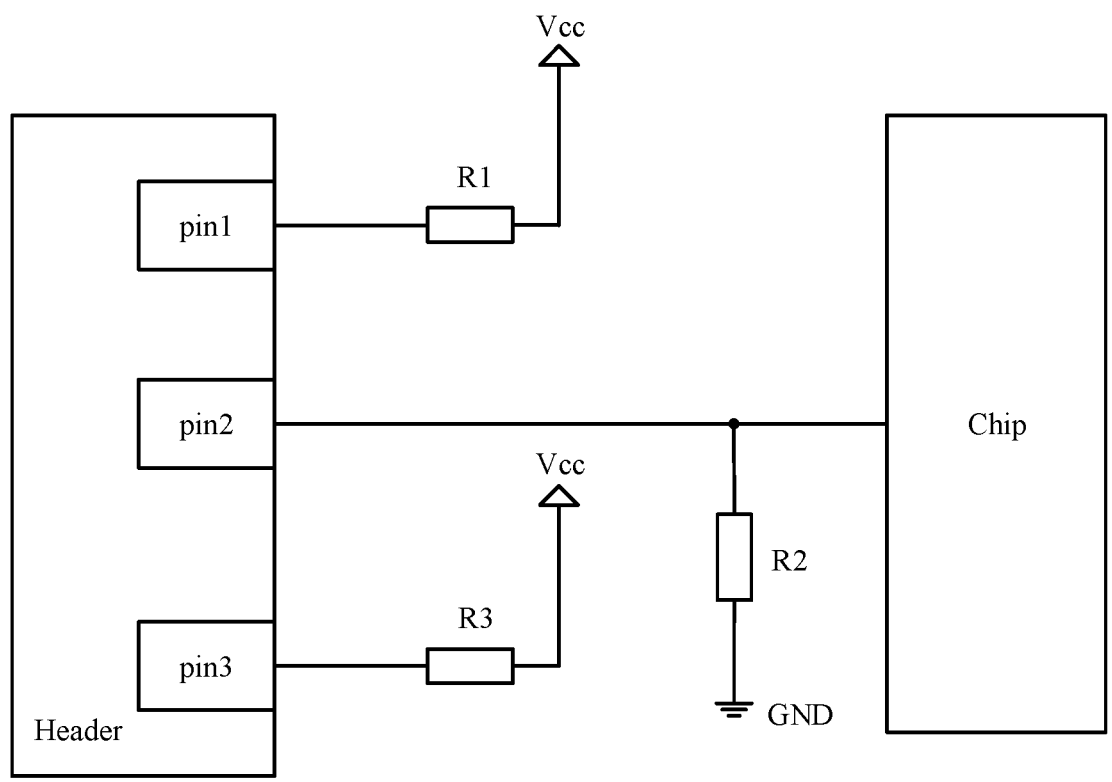
FIG. 3 is schematic diagram of a jumper cap circuit according to another embodiment of the present disclosure.

Based on the embodiment shown in FIG. 2, reference is made to FIG. 3, which is schematic diagram of a jumper cap circuit according to another embodiment of the present disclosure. As shown in FIG. 3, in the embodiment, the jumper cap circuit includes a three-pin header, a chip, a pull-down resistor R2, and a resistor R1 for dividing voltage with the pull-down resistor R2. The three-pin header is connected to the chip via the pull-down resistor R2, and a level of a first pin of the three-pin header is pulled up to Vcc by the resistor R1. In FIG. 3, a pin1 is a first pin, a pin2 is a second pin, a pin3 is a third pin. The resistor R1 is connected to the first pin, the pull-down resistor R2 is connected to the second pin, and a resistor R3 is connected to the third pin.

In the embodiment, the default input state of the chip in the jumper cap circuit is a low level state. The level of the first pin is pulled up by the resistor R1, and the second pin of the three-pin header is connected to the chip after a level of the second pin is pulled down by the pull-down resistor R2 which is grounded. The resistance of the first resistor R1 is equal to or greater than ten times of that of the second pull-up resistor R2.

According to the above arrangement, the resistor R2 serves as a pull-down resistor, the second pin of the three-pin header is connected to the chip after the level of the second pin is pulled down by the resistor R2, and the resistor R1 and the pull-up resistor R2 constitute a voltage dividing circuit, such that the input state of the chip remains at a low level state. The principle of remaining the input of the chip at logic 0 by using the resistor R1 and the resistor R2 in the jumper cap circuit no matter the jumper cap is fell off or not fell off is similar to the principle in the embodiment one of remaining the input of the chip at logic 1 in the jumper cap circuit, which is not described in detail herein.

Furthermore, in the embodiment, in the jumper cap circuit, the level of the third pin of the three-pin header is pulled up by the resistor R3, and the resistance of the pull-down resistor R2 is equal to or greater than ten times of that of the resistor R3.

As can be seen from FIG. 3, in the default input state of the jumper cap circuit, the pin1 and the pin2 are connected with a jumper cap, and a voltage supplied to the chip is equal to a voltage across the pull-down resistor R2, thus the voltage supplied to the chip is expressed by Vcc*R2/(R1+R2). Since the resistance of the first resistor R1 is equal to or greater than ten times of that of the second pull-down resistor R2, the following equation may be derived: Vcc*R2/(R1+R2)≈0, that is, the input of the chip is logic 0. In a case that the pin2 and the pin3 are connected with a jumper cap, the voltage supplied to the chip is equal to the voltage across the pull-down resistor R2, thus the voltage supplied to the chip is expressed by Vcc*R2/(R2+R3). Since the resistance of the pull-down resistor R2 is equal to or greater than ten times of that of the third resistor R3, the following equation may be derived: Vcc*R2/(R2+R3)≈Vcc, that is, the input of the chip is logic 1. If the jumper cap is fell off, as can be seen from FIG. 3, the second pin is floated, the voltage supplied to the chip is zero, that is, the input of the chip is still logic 0. Therefore, in the embodiment, the resistances of the three resistors in the jumper cap circuit are set to meet certain conditions, such that the default input state of the chip is a low level state no matter the jumper cap is fell off or not fell off, thereby ensuring the normal operation of the chip.

In addition, in the embodiment, the level of the third pin of the three-pin header may be directly pulled up via a wire.

For the part that is not described in detail in the embodiment, reference may be made to the embodiment one as shown in FIG. 2. The two embodiments may be referred to each other, and details are not repeated herein.

Embodiment Three

Figure 4:
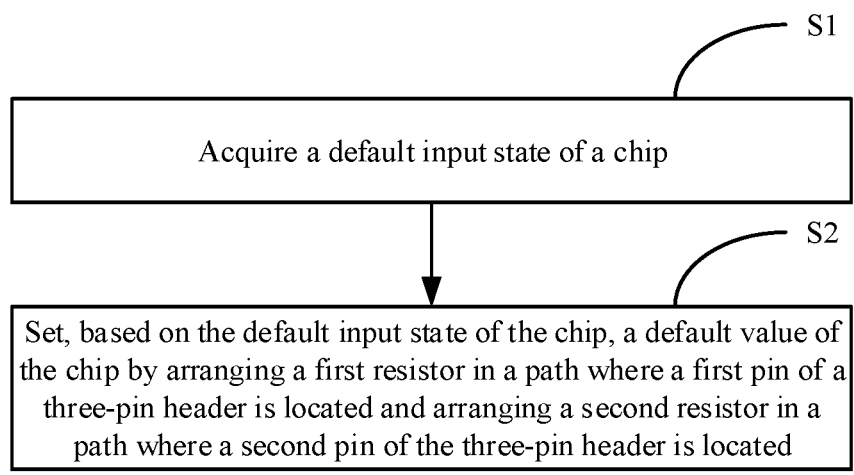
FIG. 4 is a schematic flow chart of a method for designing a jumper cap circuit according to an embodiment of the present disclosure.

Based on the embodiments as shown in FIG. 2 and FIG. 3, reference is made to FIG. 4, which is a schematic flow chart of a method for designing a jumper cap circuit according to an embodiment of the present disclosure. As shown in FIG. 4, in the present disclosure, the method for designing a jumper cap circuit mainly includes the following steps of S1 and S2.

In step S1, a default input state of a chip is acquired, where the default input state of the chip includes a high level state and a low level state.

The method of the present disclosure is mainly applicable to a jumper cap circuit including a chip and a three-pin header.

In step S2, a default value of the chip is set based on the default input state of the chip by arranging a first resistor in a path where a first pin of the three-pin header is located and arranging a second resistor in a path where a second pin of the three-pin header is located. The default value of the chip includes logic 0 or logic 1. The second resistor serves as a pull-up resistor or a pull-down resistor, and the second pin of the three-pin header is connected to the chip, and the first resistor and the second resistor constitute a voltage dividing circuit. The resistance of the first resistor is equal to or greater than ten times of that of the second resistor.

In the present disclosure, a second resistor serving as a pull-up resistor or a pull-down resistor is arranged in the path where the second pin of the three-pin header is located based on different default input states, and the voltage dividing circuit is constituted by the first resistor and the second resistor, such that the level of the input to the chip remains at the default input state, thereby effectively avoiding an abnormal operation of the chip due to the falling off of a jumper cap, thus improving the reliability of the server.

Specifically, the step S2 is performed in the following two cases.

In one case, the default input state of the chip is a high level state, the second resistor serves as a pull-up resistor, the first pin of the three-pin header is grounded via the first resistor, and the second pin of the three-pin header is connected to the chip after the level of the second pin is pulled up by the second resistor.

Further, a third pin of the three-pin header is grounded via a third resistor, where the resistance of the second resistor is equal to or greater than ten times of that of the third resistor.

In another case, the default input state of the chip is a low level state, the second resistor is grounded and serves as a pull-down resistor, the level of the first pin of the three-pin header is pulled up by the first resistor, and the second pin of the three-pin header is connected to the chip after the level of the second pin is pulled down by the second resistor.

Further, the level of the third pin is pulled up by the third resistor, and the resistance of the second resistor is equal to or greater than ten times of that of the third resistor.

In the embodiment, the operation principle and the operation method of the jumper cap circuit is described in detail in the embodiments as shown in FIG. 2 and FIG. 3. The three embodiments may be referred to each other, and details are not repeated herein.

The embodiments described above only specific embodiments of the present disclosure, which are used to understand or implement the present disclosure by those skilled in the art. It is apparent that various modifications to these embodiments may be made by those skilled in the art, and the general principles defined in the present disclosure may be implemented in other embodiments without departing from the principle or scope of the present disclosure. Therefore, the present disclosure is not limited to the embodiments described herein, but complies with the broadest scope consistent with the principles and novel features disclosed herein.

The invention claimed is:

1. A jumper cap circuit, comprising:
a three-pin header comprising a first pin, a second pin and a third pin;
a chip;
a resistor R1, a resistor R2, and a resistor R3, wherein the three-pin header is connected to the chip via the resistor R2, and the resistor R1 is connected to the first pin, the resistor R3 is connected to the third pin, wherein
the resistor R2 serves as a pull-up resistor R2 or a pull-down resistor R2 and is configured to constitute a voltage dividing circuit with the resistor R1 or the resistor R3, and wherein
the resistance of the resistor R1 is equal to or greater than ten times of that of the resistor R2.

2. The jumper cap circuit according to claim 1, wherein if a default input state of the jumper cap circuit is a high level state, the resistor R2 serves as the pull-up resistor R2, and the first pin of the three-pin header is grounded via the resistor R1, the second pin of the three-pin header is connected to the chip after a level of the second pin is pulled up by the pull-up resistor R2, and the third pin of the three-pin header is grounded via the resistor R3.

3. The jumper cap circuit according to claim 2, wherein the resistance of the pull-up resistor R2 is equal to or greater than ten times of that of the resistor R3.

4. The jumper cap circuit according to claim 2, wherein the chip is provided with a Strap pin.

5. The jumper cap circuit according to claim 1, wherein if a default input state of the jumper cap circuit is a low level state, the resistor R2 serves as the pull-down resistor R2 which is grounded, and a level of the first pin of the three-pin header is pulled up by the resistor R1, the second pin of the three-pin header is connected to the chip after a level of the second pin is pulled down by the pull-down resistor R2, and a level of the third pin of the three-pin header is pulled up by the resistor R3.

6. The jumper cap circuit according to claim 5, wherein the resistances of the pull-down resistor R2 is equal to or greater than ten times of that of the resistor R3.

7. The jumper cap circuit according to claim 5, wherein the chip is provided with a Strap pin.

8. The jumper cap circuit according to claim 1, wherein the chip is provided with a Strap pin.

\* \* \* \* \*